US007862756B2

(12) United States Patent
Wuister et al.

(10) Patent No.: US 7,862,756 B2
(45) Date of Patent: Jan. 4, 2011

(54) IMPRINT LITHOGRAPHY

(75) Inventors: Sander Frederik Wuister, Eindhoven (NL); Johan Frederik Dijksman, Weert (NL); Yvonne Wendela Kruijt-Stegeman, Eindhoven (NL); Ivar Schram, Weert (NL)

(73) Assignee: ASML Netherland B.V., Veldhoven (NL)

( * ) Notice: Subject to any disclaimer, the term of this patent is extended or adjusted under 35 U.S.C. 154(b) by 938 days.

(21) Appl. No.: 11/392,950

(22) Filed: Mar. 30, 2006

(65) Prior Publication Data

US 2007/0238037 A1    Oct. 11, 2007

(51) Int. Cl.
*B29C 43/00* (2006.01)
(52) U.S. Cl. ............... 264/227; 264/226; 264/220; 430/22
(58) Field of Classification Search ........... 264/227, 264/226, 220; 430/22
See application file for complete search history.

(56) References Cited

U.S. PATENT DOCUMENTS

| 4,988,741 | A * | 1/1991 | Stein ................... 522/31 |
| 5,346,654 | A * | 9/1994 | Kodaka et al. ........... 264/1.33 |
| 6,482,742 | B1 | 11/2002 | Chou |
| 2001/0007682 | A1 * | 7/2001 | Chiu et al. ............. 425/127 |
| 2004/0245669 | A1 * | 12/2004 | Nishi et al. ............. 264/219 |
| 2005/0230882 | A1 | 10/2005 | Watts et al. ............. 264/496 |
| 2005/0253296 | A1 * | 11/2005 | Landis et al. ............ 264/219 |
| 2006/0040058 | A1 * | 2/2006 | Heidari et al. ........... 427/256 |
| 2006/0279025 | A1 * | 12/2006 | Heidari et al. ........... 264/496 |

FOREIGN PATENT DOCUMENTS

| JP | 2003-276030 | 9/2003 |
| JP | 2004-288845 A | 8/2010 |
| WO | 2004/090636 | 10/2004 |

OTHER PUBLICATIONS

Office Action in related Japanese Application No. 2007-075810 mailed May 24, 2010.

* cited by examiner

*Primary Examiner*—Khanh Nguyen
*Assistant Examiner*—Saeed M Huda
(74) *Attorney, Agent, or Firm*—Pillsbury Winthrop Shaw Pittman LLP

(57) ABSTRACT

A method of making a substantial replica of a first imprint template which bears a first pattern is disclosed. The method includes filling recesses of the first pattern with a first material, removing the first material from the first imprint template to form a second imprint template which bears a second pattern, the second pattern being the substantial inverse of the first pattern, filling recesses of the second pattern with a photo-curable medium, curing the photo-curable medium by illuminating it with radiation, and removing the cured medium from the second imprint template to form a third imprint template which bears a pattern that is a substantial replica of the first pattern.

20 Claims, 6 Drawing Sheets

IMPRINT LITHOGRAPHY

FIELD

The present invention relates to imprint lithography.

BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using radiation of shorter wavelength. However, there are problems associated with such a reduction. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or imprint template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate such as a semiconductor material into which the pattern defined by the imprint template is to be transferred. Imprint lithography is thus essentially a moulding process on a micrometer or nanometer scale in which the topography of a imprint template defines the pattern created on a substrate. Patterns may be layered as with optical lithography processes so that, in principle, imprint lithography could be used for such applications as IC manufacture.

The resolution of imprint lithography is typically limited only by the resolution of the imprint template fabrication process. For instance, imprint lithography may be used to produce features in the sub-50 nm range with significantly improved resolution and line edge roughness compared to that achievable with a conventional optical lithography process. In addition, an advantage of imprint processes includes that they generally do not require expensive optics, advanced illumination sources or specialized resist materials that are often required in optical lithography processes.

Fabrication of an imprint template would typically be performed using electron beam lithography, which is generally time consuming and expensive (electron beam lithography machines are expensive to buy and to run).

SUMMARY

According to an aspect of the present invention, there is provided a method of making a substantial replica of a first imprint template which bears a first pattern, the method comprising:
  filling recesses of the first pattern with a first material;
  removing the first material from the first imprint template to form a second imprint template which bears a second pattern, the second pattern being the substantial inverse of the first pattern;
  filling recesses of the second pattern with a photo-curable medium;
  curing the photo-curable medium by illuminating it with radiation; and
  removing the cured medium from the second imprint template to form a third imprint template which bears a pattern that is a substantial replica of the first pattern.

According to another aspect of the invention, there is provided a method of making an imprint template, the method comprising:
  covering at least part of a substrate with negative resist;
  patterning the negative resist using an electron beam lithography apparatus;
  developing and etching the resist to form a first imprint template which bears a pattern which is the inverse of a desired pattern;
  filling recesses of the pattern with photo-curable medium;
  illuminating the photo-curable medium with radiation; and
  removing the cured medium from the first imprint template to provide a second imprint template which substantially bears the desired pattern.

One or more embodiments of the present invention are applicable to any imprint lithography process in which a patterned imprint template is imprinted into an imprintable medium in a flowable state, and for instance can be applied to hot and UV imprint lithography as described above. For the purpose of understanding one or more embodiments of the present invention, it is not necessary to describe the imprint process in any more detail than given herein and is known in the art.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
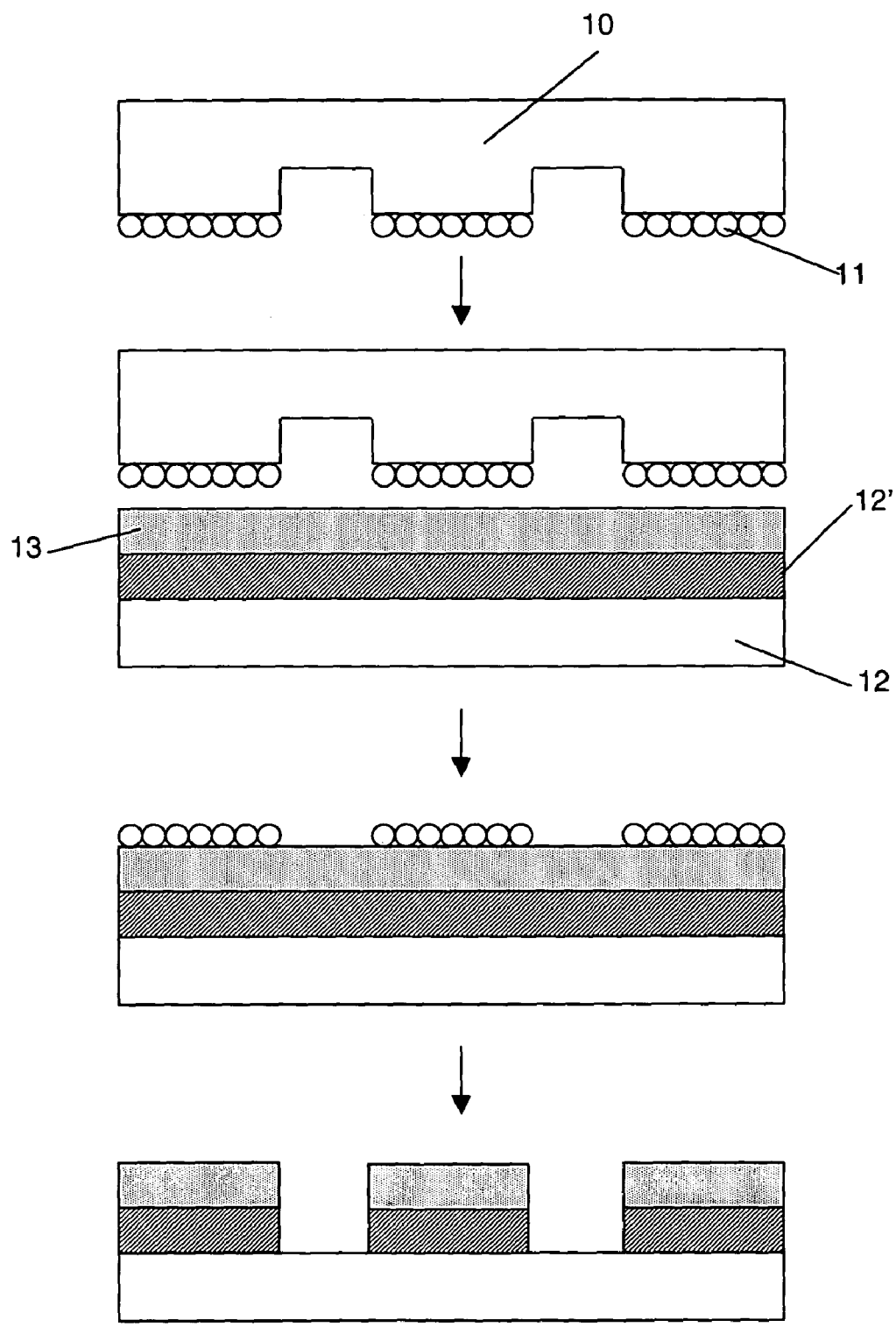
FIG. 1a-1c illustrate examples of conventional soft, hot and UV lithography processes respectively.
Figure 1B:
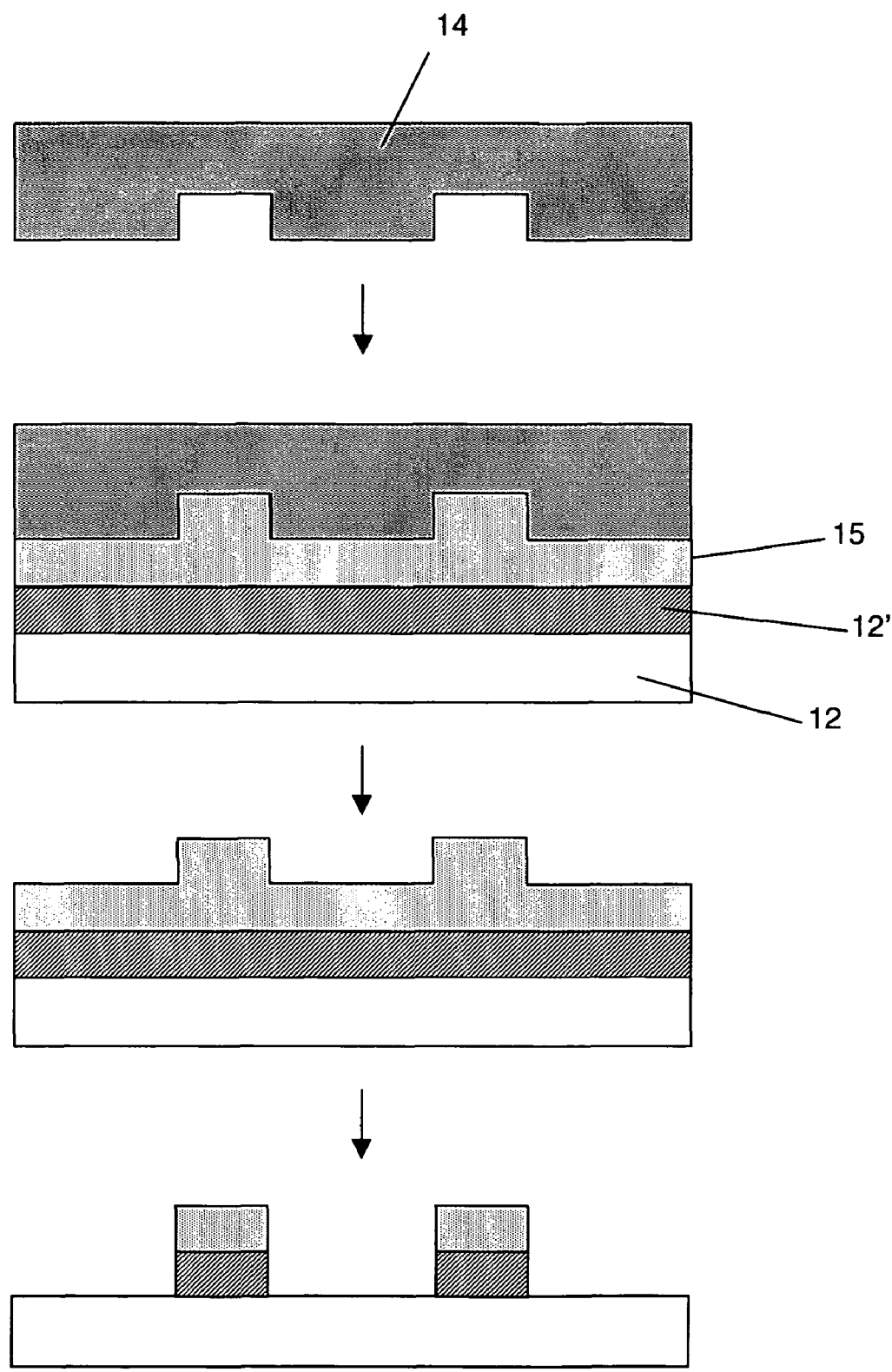
Figure 1C:
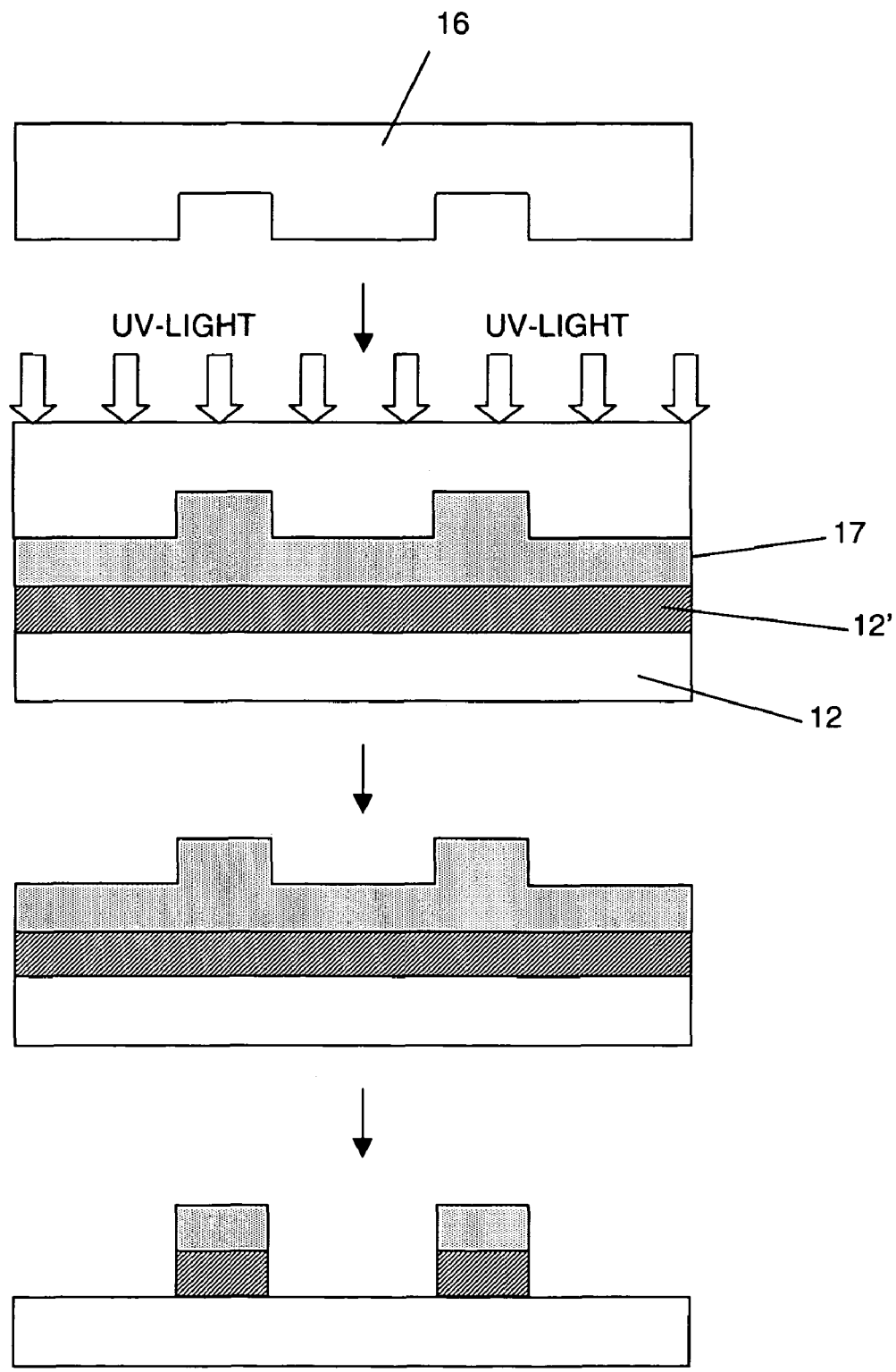

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist. The residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of a substrate 12. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
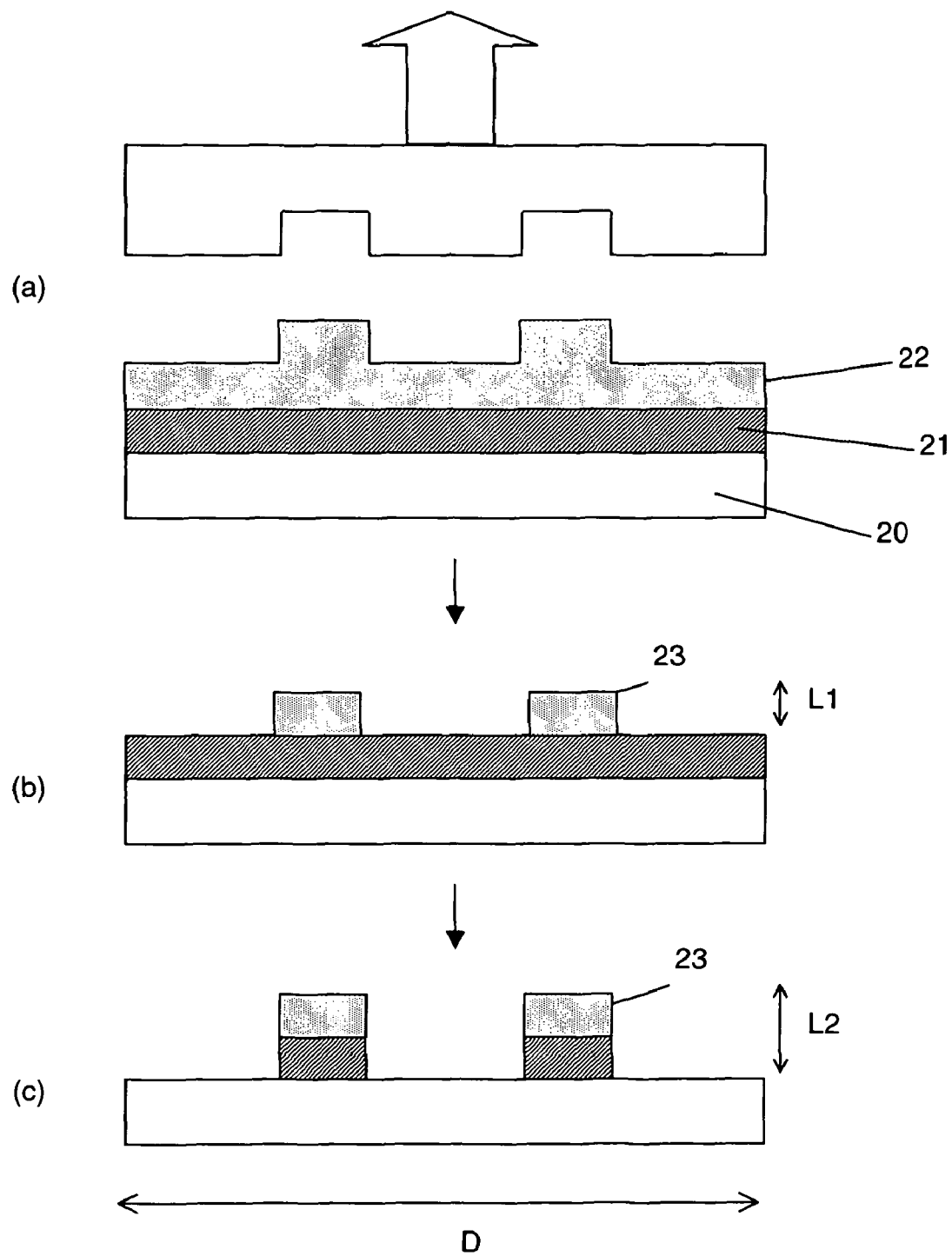
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only is the pattern transfer performed at a higher temperature, but also relatively large temperature differences might be required in order to ensure the resin is adequately solidified before the template is removed. Temperature differences between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically comprising a monomer such as an acrylate or methacrylate. for example. In general, any photopolymerizable material could be used, such as a mixture of monomers and an initiator. The curable liquid may also, for instance, include a dimethyl siloxane derivative. Such materials tend to be less viscous than the thermosetting and thermoplastic resins used in hot imprint lithography and consequently move faster to fill template pattern features. Low temperature and low pressure operation also favors higher throughput capabilities. Although the name 'UV imprint lithography' implies that UV radiation is always used, those skilled in the art will be aware that any suitable actinic radiation may be used (for example, visible light may be used). Hence, any reference herein to UV imprint lithography, UV radiation, UV curable materials, etc. should be interpreted as including any suitable actinic radiation, and should not be interpreted as being limited to UV radiation only.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures may be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce or minimize pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic when relatively volatile UV curable resins are employed.

One approach to addressing this problem is the so-called 'drop on demand' process in which the resin is dispensed onto a target portion of the substrate in droplets immediately prior to imprinting with the template. The liquid dispensing is controlled so that a certain volume of liquid is deposited on a particular target portion of the substrate. The liquid may be dispensed in a variety of patterns and the combination of carefully controlling liquid volume and placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch fluid, the resin will have nowhere to flow.

Although reference is made herein to depositing UV curable liquids onto a substrate, the liquids could also be deposited on the template and in general the same techniques and considerations will apply.

Figure 3:
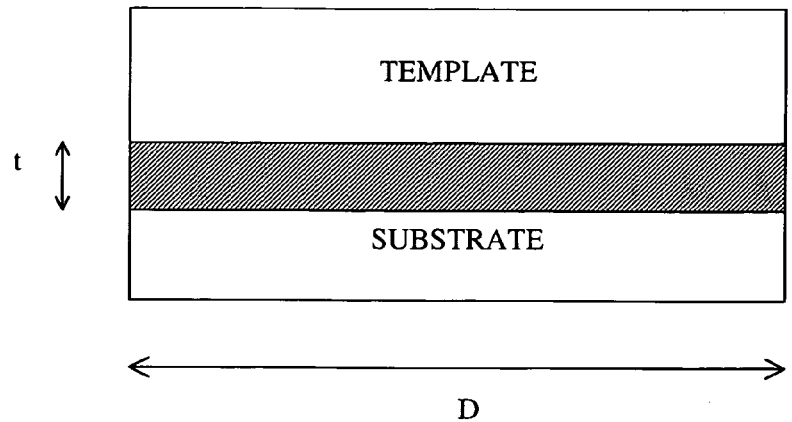
FIG. 3 schematically illustrates an imprint template and a typical imprintable resist layer deposited on a substrate.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template.

The residual layer left after stamping is useful in protecting the underlying substrate, but as mentioned herein it may also be the source of a problem, particularly when high resolution and/or minimum CD (critical dimension) variation is desired. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV lithography are generally formed in a two-stage process. Initially, the desired pattern is written using, for example, electron beam writing (e.g., with an electron beam pattern generator), to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV lithography, epitaxial growth, thin film deposition, chemical etching, plasma etching, ion etching or ion milling could be used. Generally, a technique capable of very high resolution will be used as the template is effectively a 1× mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and often quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as electrical or thermal conductivity, optical linear or non-linear response, among others. For example, the functional material may form a conductive layer, a semi-conductive layer, a dielectric layer or a layer having another desirable mechanical, electrical or optical property. Some organic substances may also be appropriate functional materials. Such applications may be within the scope of an embodiment of the present invention.

In some instances it may be desired to have more than one imprint template bearing the substantially same pattern. Where this is the case it is conventional to make each of the imprint templates using electron beam lithography, as described further above. An embodiment of the invention provides an alternative method of making an imprint template. The embodiment of the invention is particularly suited to, although not limited to, making multiple imprint templates bearing the substantially same pattern.

Figure 4:
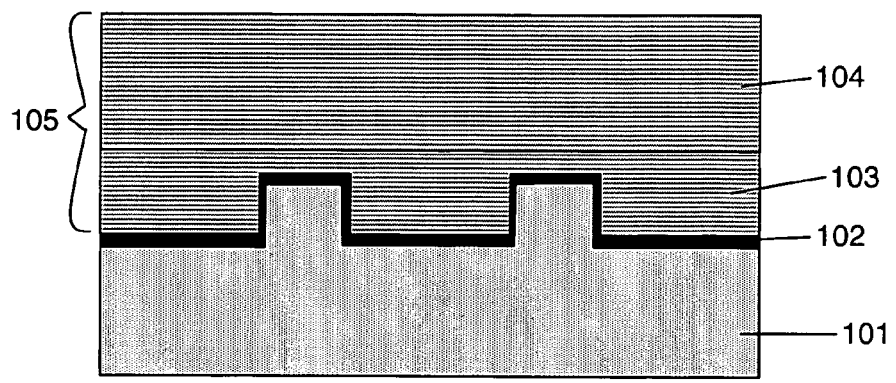
FIG. 4 schematically illustrates making a nickel imprint template according to an embodiment of the invention.

An imprint template is manufactured using electron beam lithography in a conventional manner, as described further above. A schematic illustration of this imprint template, which may for example be made from quartz, is shown in FIG. 4. The quartz imprint template 101 is provided with a release layer 102. A suitable material for the release layer is described further below. A first layer of nickel 103 is applied to the quartz imprint template 101, using for example chemical vapor deposition (CVD) or a sputtering technique. Following this a macroscopic layer of nickel 104 is grown onto the first nickel layer 103 using electroplating. The first layer of nickel 103 fills recesses of the imprint template 101 and provides a smooth upper surface which receives the macroscopic nickel layer 104.

The first layer of nickel 103 and the macroscopic layer 104 together form a nickel imprint template 105. The nickel imprint template 105 is removed from the quartz imprint template 101, the release layer 102 assisting in ensuring that the nickel imprint template and quartz imprint template may be separated from one another. The pattern provided on the nickel imprint template 105 is the inverse of the pattern provided on the quartz imprint template 101.

The nickel imprint template 105 may be provided with a release layer (not illustrated). A suitable material for the release layer is described further below.

Figure 5:
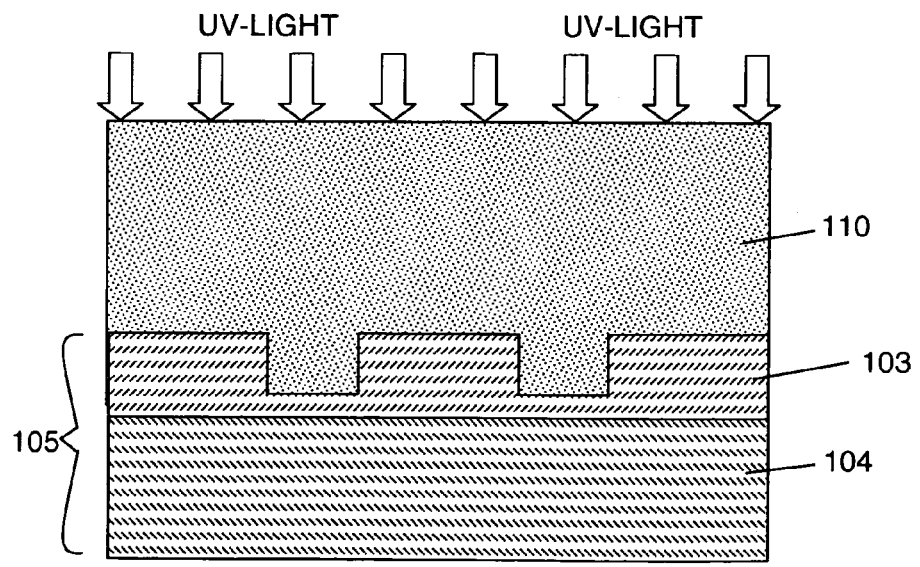
FIGS. 5 and 6 schematically illustrate making an imprint template using the nickel imprint template of FIG. 4.

The nickel imprint template 105 may be used to make copies of the quartz imprint template 101 (i.e. to make multiple imprint templates bearing substantially the same pattern as the quartz imprint template). The nickel imprint template 105 is inverted and then a photo-curable medium 110 is deposited onto it, as shown schematically in FIG. 5. The photo-curable medium 110 comprises a monomer, a photo-initiator and a cross-linker. The monomer may, for example, comprise an epoxy, (meth)acrylate or vinyl group. The photo-initiator is described further below. The cross-linker may be a molecule containing at least two of the epoxy, (meth)acrylate or vinyl groups.

The photo-curable medium 110 is illuminated using ultraviolet radiation. The ultraviolet radiation cures the photo-curable medium 110 such that it solidifies. The now solid cured medium 110 is separated from the nickel imprint template 105. The cured medium 110 forms an imprint template which is a substantial replica of the quartz imprint template 101, and may be used to imprint a pattern onto a lithographic substrate. The embodiment of the invention thus provides a method of forming an imprint template which is more convenient and cheaper than the conventional electron beam manufacture. It will be appreciated that any number of imprint templates may be made using the embodiment of the invention. This allows cheap and convenient manufacture of substantial replicas of an original imprint template.

The photo-initiator provided in the photo-curable medium 110 is selected to have a low absorption at the wavelength which will be directed through the cured medium imprint template during subsequent imprinting. A photo-initiator may, for example, be selected which absorbs radiation at shorter wavelengths than the radiation that will be used during subsequent imprinting. For example, the photo-initiator could be Irgacure 250 (available from Ciba Specialty Chemicals Inc., Basel, Switzerland), which is a photo-acid generator that can be used for the initiation of polymerization of epoxy and vinyl groups, and has an absorption maximum at around 245 nanometers. A mercury light emitting radiation at around 365 nanometers may be used during subsequent imprinting. Irgacure 250 is effectively transparent at 365 nanometers (and for shorter wavelengths up to around 340 nanometers), and so would not absorb a significant amount of the 365 nanometer radiation. Other photo-initiators which may be used for free-radical based photo-polymerization include Irgacure 184 and Darocure 1173 (available from Ciba Specialty Chemicals Inc., Basel, Switzerland).

As mentioned above, the quartz imprint template 101 and/or the nickel imprint template 105 may be provided with a release layer to facilitate release of the nickel imprint template 105 from the quartz imprint template 101 and/or the release of the cured medium 110 from the nickel imprint template 105. The release layer may comprise for example a monolayer of a fluorinated alkyltrichlorosilane like trichloro (1H,1H,2H,2H-perfluorooctyl)silane, or may be, for example, 1H,1H,2H,2H-Perfluorodecanethiol.

Instead of or in addition to providing the nickel imprint template 105 with a release layer, the photo-curable medium 110 may include one or more substances that provide release layer properties. This may be done by selecting the monomer and the cross-linker to be molecules which create surfaces having low surface tension. Suitable materials include dimers, for example fluorinated epoxies or acrylates. Examples are fluor-containing monomers like 3-perfluorobutyl 1,2-epoxypropane or 3-perfluorohexyl 1,2-epoxypropane (both available from Oakwood Products, Inc., West Columbia, S.C., USA) and 1,4-bis(2'3'-epoxypropyl)-perfluoro-n-butane (available from Fluorochem Ltd., Old Glossop, Derbyshire, UK) as cross-linker. In some instances it may be desirable to provide a release layer on the nickel imprint template 105 and also use a photo-curable medium 110 which provides release layer properties.

Figure 6:
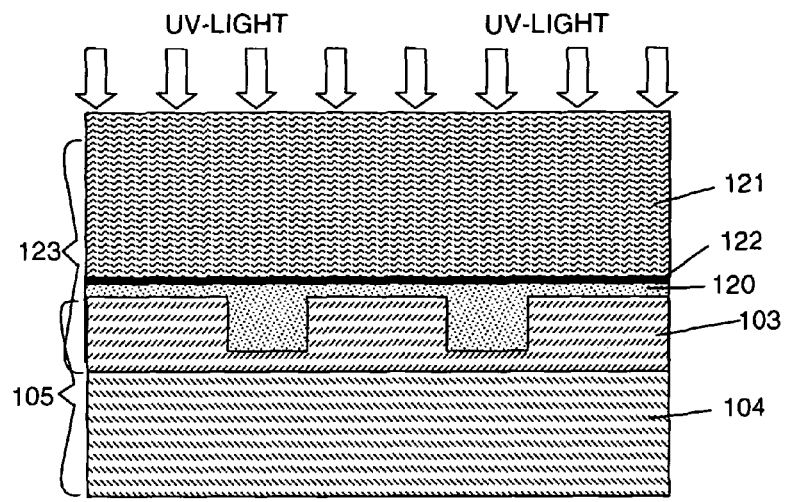

It may be desired to provide the imprint template on a quartz substrate rather than forming the imprint template entirely from cured medium. This may be achieved, for example, as shown in FIG. 6, by depositing a layer of photo-curable medium 120 onto the nickel imprint template 105. The photo-curable medium layer 120 may be thin, for example hundreds of nanometers in thickness, and therefore may be deposited for example using ink-jet type printing. The photo-curable medium 120 comprises a monomer, a cross-linker and a photo-initiator (these materials may correspond with those described above). A quartz substrate 121 is provided with a primer layer 122, which comprises a material which adheres well to quartz. Examples of suitable primers are epoxy-silanes like 5,6 epoxyhexyltrimethoxysilane (available from Gelest, Inc., Morrisville, Pa., USA) or acrylate-silanes like (3-acryloxypropyl)trimethoxysilane (available from Fluorochem Ltd., Old Glossop, Derbyshire, UK). The quartz substrate 121 is inverted and is placed on top of the layer of photo-curable medium 120 such that the primer layer 122 is in contact with the photo-curable medium 120.

Ultraviolet radiation is directed through the quartz substrate and cures the photo-curable medium 120, monomers in the medium forming polymers such that the medium solidifies. The polymers of the cured medium 120 react with the primer layer 122 such that the cured medium 120 and the primer layer 122 are secured to one another. The quartz substrate 121, primer layer 122, and cured medium 120 thus form an imprint template 123 which is a substantial replica of the original quartz imprint template 101 and may be used to a imprint pattern onto a lithographic substrate. The method of forming the imprint template is more convenient and cheaper than conventional electron beam manufacture. It will be appreciated that any number of imprint templates may be made using the same nickel imprint template 105. This allows cheap and convenient manufacture of substantial replicas of an original imprint template.

The photo-curable medium 120, as previously mentioned, may be thin (e.g. less than 500 nanometers). This means that absorption of ultraviolet radiation (or other actinic radiation) in this layer should be negligible. For this reason it is not essential that the photo-initiator provided in the photo-curable medium 120 has a low absorption at the wavelength which will subsequently be used when imprinting a lithographic substrate. It is of course possible to use a photo-initiator which has low absorption at the relevant wavelength if desired.

The photo-curable medium 120 may be formed from one or more substances selected such that the resulting cured medium has a surface with a low surface tension. Such a surface may act as a release layer. Suitable materials which may be used in this respect are described further above. Additionally, a release layer may be provided on the nickel imprint template as described further above.

Figures 7A, 7B:
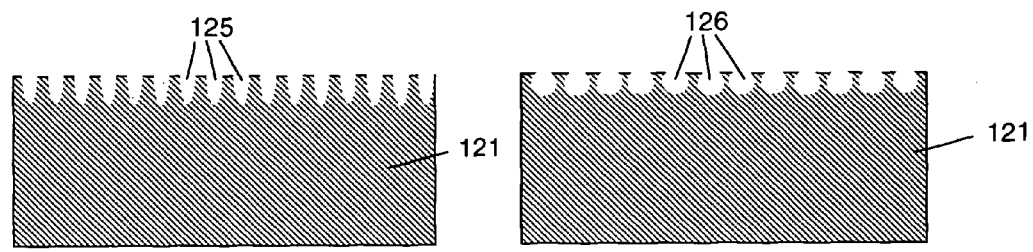
FIG. 7 illustrates structures provided on a substrate which may form part of the imprint template shown in FIG. 6.

The surface of the quartz substrate 121 which contacts the photo-curable medium layer 120 may be provided with structure. Such a structure may allow the quartz substrate 121 to directly adhere to the photo-curable medium 120. The structure may, for example, be patterned using optical lithography and/or etching, and has an effect of increasing the contact area between the quartz substrate 121 and the photo-curable medium 120, thereby providing a strong adhesion between the quartz substrate 121 and the medium 120 when it is cured. FIG. 7 shows two examples of suitable structures. FIG. 7a shows a structure which has been formed via optical lithography and etching. The etching may, for example, be a directional ion etch or a wet etch. The structure comprises an array of recesses 125 in the surface of the quartz substrate 121. FIG. 7b shows a quartz substrate 121 in which the etching has been prolonged such that the structure comprises an array of recesses 126 which have undercuts. Both of the structures shown in FIG. 7 allow for strong bonding between the quartz substrate 121 and the photo-curable medium 120.

Where the quartz substrate 121 is provided with a pattern, this may cause some (back) scattering of radiation during subsequent use of the imprint template (the scattering occurring at the interface between the quartz substrate 121 and the cured medium 120). This disadvantage may be reduced or eliminated by matching the refractive index of the quartz substrate 121 and the cured medium 120. The refractive index of quartz is 1.54. The refractive index of a polymer is dependent upon the type of monomer used (acrylate, epoxy, vinyl) for polymerization. Furthermore, the refractive index of the polymer increases if the cross-linking density (induced by the concentration of cross-linker) increases. These degrees of freedom may be used to adjust the refractive index of the cured medium 120. If it is desired to have a certain degree of scattering, for example because this would yield a more homogeneous exposure during imprint, the refractive index of the cured medium 120 may be selected to be different from the refractive index of the quartz substrate 121. The refractive index of the cured medium 120 may be referred to as being substantially matched to that of the quartz substrate, meaning that it is the same or sufficiently close that a desired amount of scattering takes place.

In an alternative embodiment of the invention, during production of the original quartz imprint template, the quartz imprint template is covered with negative resist in place of conventional positive resist. Positive resist acts such that developing and etching of the resist removes any resist which has not been exposed, thereby forming a pattern which is defined in the exposed resist. Negative resist works in the opposite way to positive resist, such that developing and etching of the resist removes only resist which has been exposed, forming a pattern which is defined in the unexposed resist. The resist pattern is transferred into a thin layer of chrome which forms the mask for the final, anisotropic etch step to transfer the pattern into the base material of the imprint template. By using negative resist when making the original quartz imprint template, the resulting imprint template bears a pattern which is an inverse of the pattern that would be seen if positive resist were to be used. Therefore, instead of producing the original quartz imprint template and then using a nickel imprint template to form substantial replicas of the quartz imprint template, the quartz imprint template constructed using negative resist may be used to directly form imprint templates.

Figure 8:
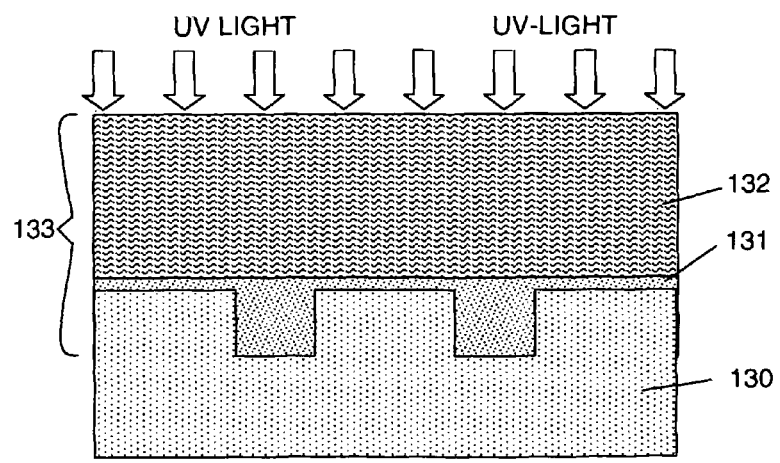
FIG. 8 schematically illustrates making an imprint template according to an alternative embodiment of the invention.

The alternative embodiment of the invention is illustrated schematically in FIG. 8. A quartz imprint template 130 is provided with a pattern which is equivalent to the inverse pattern formed in the above described nickel imprint template (the quartz imprint template 130 having been formed via the use of negative resist). A layer of photo-curable medium 131 is provided on the quartz imprint template 130. A quartz substrate 132, which may be provided with a structure of the type shown in FIG. 7, is brought into contact with the photo-curable medium 131. Ultraviolet radiation is directed through the quartz substrate 132 onto the photo-curable medium 131. The photo-curable medium 131 is cured and solidifies, thereby bonding to the quartz substrate 132. The quartz substrate 132 and the cured medium 131 together form an imprint template 133 which may be used to imprint a pattern onto a lithographic substrate.

One manner in which the alternative embodiment of the invention may be used is in a situation where a multiplicity of imprint templates bearing the same pattern is required. A data file to be used to steer the electron beam is defined in the conventional manner (as though an imprint template was going to be made in the conventional way). The quartz substrate is covered with negative resist, and the electron beam is used to write the pattern onto the resist. The negative resist is developed and the resulting pattern is used to make a quartz imprint template. The resulting quartz imprint template is used to make a multiplicity of imprint templates having the required pattern, in the manner described above in relation to FIG. 8. Since the data file is generated in the conventional manner, this method of making imprint templates is convenient to use, and allows many imprint templates to be made with a required pattern.

It will be appreciated that the second embodiment of the invention may include features of the first embodiment of the invention. For example, a release layer may be used, or the photo-curable medium 131 may include substances which provide release properties. Similarly, a substrate may be secured to the photo-curable medium 131.

While specific examples of the invention have been described above, it will be appreciated that the present invention may be practiced otherwise than as described. The description is not intended to limit the invention.

Although the above description has referred to the used of quartz as a substrate/imprint template, it will be appreciated that other suitable materials may be used. Similarly, although the description refers to the use of nickel it will be appreciated that one or more other suitable metals may be used. In some instances a polymer may be used instead of nickel.

The invention claimed is:

1. A method of making a substantial replica of a first imprint template which bears a first pattern, the method comprising:
    filling recesses of the first pattern of the first imprint template with a first material, wherein the first material is one or more metals and the first imprint template is constructed and arranged to imprint its pattern to an imprintable medium by imprint lithography;
    removing the first material from the first imprint template to form a second imprint template which bears a second pattern, the second pattern being the substantial inverse of the first pattern;
    depositing a photo-curable medium onto the second pattern so as to fill recesses of the second pattern with said photo-curable medium;
    curing the photo-curable medium by illuminating it with radiation, wherein subsequent to said removing, the second imprint template is inverted to enable the depositing of the photo-curable medium onto the second pattern and the curing of the photo-curable medium; and
    removing the cured medium from the second imprint template to form a third imprint template which bears a pattern that is a substantial replica of the first pattern, the third template configured to imprint its pattern to an imprintable medium.

2. The method of claim 1, wherein the metal is nickel.

3. The method of claim 1, wherein one or more of the metals is applied into the recesses using chemical vapor deposition or sputtering.

4. The method of claim 3, wherein, following the chemical vapor deposition or sputtering, applying one or more of the metals using electroplating.

5. The method of claim 1, further comprising contacting a substrate against the photo-curable medium prior to illuminating the medium, the substrate being secured to the photo-curable medium when the photo-curable medium is cured.

6. The method of claim 5, wherein the substrate has a structure comprising an array of recesses to aid securing the substrate to the photo-curable medium.

7. The method of claim 5, wherein the substrate comprises a primer layer to aid securing the substrate to the photo-curable medium.

8. The method of claim 5, wherein the photo-curable medium is selected to have a refractive index which is substantially matched to that of the substrate.

9. The method of claim 1, wherein the second imprint template comprises a release layer to assist removing the cured medium from the second imprint template.

10. The method of claim 1, wherein the photo-curable medium includes one or more substances that provide release layer properties.

11. The method of claim 1, further comprising again filling recesses of the second pattern with photo-curable medium, curing the photo-curable medium by illuminating it with radiation, and removing the cured medium from the second imprint template to form a fourth imprint template which bears a pattern that is a substantial replica of the first pattern.

12. A method of making an imprint template, the method comprising:
    covering at least part of a substrate with negative resist;
    patterning the negative resist using an electron beam lithography apparatus;
    developing and etching the resist to form a first imprint template which bears a pattern which is the inverse of a desired pattern;
    filling recesses of the pattern with photo-curable medium;
    illuminating the photo-curable medium with radiation; and
    removing the cured medium from the first imprint template to provide a second imprint template which substantially bears the desired pattern.

13. The method of claim 12, further comprising once again filling recesses of the pattern of the first imprint template with photo-curable medium, illuminating the photo-curable medium with radiation, and removing the cured medium from the first imprint template to provide a further imprint template which substantially bears the desired pattern.

14. The method of claim 12, further comprising contacting a substrate against the photo-curable medium prior to illuminating the medium, the substrate being secured to the photo-curable medium when the photo-curable medium is cured.

15. The method of claim 14, wherein the substrate has a structure comprising an array of recesses to aid securing the substrate to the photo-curable medium.

16. The method of claim 14, wherein the substrate comprises a primer layer to aid securing the substrate to the photo-curable medium.

17. The method of claim 14, wherein the photo-curable medium is selected to have a refractive index which is substantially matched to that of the substrate.

18. The method of claim 12, wherein the first imprint template comprises a release layer to assist removing the cured medium from the first imprint template.

19. The method of claim 12, wherein the photo-curable medium includes one or more substances that provide release layer properties.

20. The method of claim 1, wherein the first pattern of the first imprint template is made using an electron beam lithography apparatus.

* * * * *